United States Patent [19]

Hu

[11] Patent Number: 6,127,249
[45] Date of Patent: Oct. 3, 2000

[54] METAL SILICIDATION METHODS AND METHODS FOR USING SAME

[75] Inventor: Jeff Hu, Boise, Id.

[73] Assignee: Micron Technology, Inc., Boise, Id.

[21] Appl. No.: 08/803,528

[22] Filed: Feb. 20, 1997

[51] Int. Cl.$^7$ .......................... H01L 21/324; H01L 21/33; H01L 21/331; H01L 21/335

[52] U.S. Cl. .......................... 438/583; 438/597; 438/651; 438/655; 438/658; 438/660; 438/663; 438/664; 257/384; 257/754; 257/757; 257/768; 257/769

[58] Field of Search ..................................... 438/303, 535, 438/607, 586, 655, 583, 651, 664

[56] References Cited

U.S. PATENT DOCUMENTS

| | | | |
|---|---|---|---|
| 4,971,655 | 11/1990 | Stefano et al. | 156/659.1 |
| 5,047,367 | 9/1991 | Wei et al. | 438/607 |
| 5,162,259 | 11/1992 | Kolar et al. | 437/192 |
| 5,196,360 | 3/1993 | Doan et al. | 438/586 |
| 5,198,382 | 3/1993 | Campbell et al. | 437/46 |
| 5,302,552 | 4/1994 | Duchateau et al. | 437/200 |
| 5,356,837 | 10/1994 | Geiss et al. | 437/200 |
| 5,449,631 | 9/1995 | Giewont et al. | 438/303 |
| 5,482,895 | 1/1996 | Hayashi et al. | 437/200 |
| 5,529,958 | 6/1996 | Yaoita | 438/655 |
| 5,536,684 | 7/1996 | Dass et al. | 438/535 |
| 5,567,651 | 10/1996 | Berti et al. | 438/303 |
| 5,849,634 | 12/1998 | Iwata | 438/655 |

FOREIGN PATENT DOCUMENTS

| | | | |
|---|---|---|---|
| H7-283217 | 10/1995 | Japan | H01L 21/3205 |

OTHER PUBLICATIONS

Ho and Nicolet, "Application of Nitrogen in a Cobalt Silicide–Forming System", Thin Solid Films, 127 (1985) 313–322.

Byun et al., "Effect of Deposition Temperature and Sputtering Ambient on In Situ Cobalt Silicide Formation," *J. Electrochem. Soc.*, 144, pp. 3175–3179 (1997).

A. Atanos et al., "New Method for the Formation and Anneal of Cobalt Silicide", 4$^{th}$ Conf. on Advanced Thermal Processing of Semiconductors—RTP '96, Sep. 11–13, 1996, pp. 389–394.

A. Berti et al., "A Manufacturable Process for the Formation of Self Aligned Cobalt Silicide ina Sub Micrometer CMOS Technology", 9$^{th}$ Int'l VLSI Multilevel Interconnection Conference—VMIC '92, Jun. 9–10, 1992, pp. 267–273.

K. Goto et al., "Optimization of Salicide Processes for sub 0.1–$\mu$m CMOS Devices", 1994 Symposium on VLSI Technology Digest of Technical Papers, pp. 119–120.

T. Ohguro et al., "Nitrogen–doped nickel monosilicide technique for deep submicron CMOS salicide", Int'l Electron Devices Meeting '95, Dec. 10–13, 1995, pp. 18.3.1–18.3.4.

T.I. Selinder et al, "In Situ X–Ray Diffraction Study of the Role of Annealing Ambient in Epitaxial CoSi$_2$ Growth from Co/Ti Bilayers on Si9100)", *Appl. Phys. Lett.*, 67(11) pp. 1597–1599 (1995).

(List continued on next page.)

*Primary Examiner*—Tom Thomas
*Assistant Examiner*—Bernard E. Souw
*Attorney, Agent, or Firm*—Mueting, Raasch & Gebhardt, P.A.

[57] ABSTRACT

A method for use in the fabrication of semiconductor devices includes forming a layer of nitridated cobalt on a surface including silicon. A film cap including titanium is formed over the layer of cobalt and a thermal treatment is performed to form cobalt silicide from the layer of cobalt and the silicon. Further, a layer of cobalt or nickel may be formed over a titanium film on a surface including silicon. The titanium film is formed in an atmosphere including at least one of nitrogen and oxygen and a thermal treatment is performed for reversal and silicidation of the titanium film and the layer of cobalt or nickel to form cobalt silicide or cobalt nickel. The methods may be used for silicidation of a contact area, in forming a polycide line, or in use for other metal silicidation applications.

23 Claims, 15 Drawing Sheets

OTHER PUBLICATIONS

Q.F. Wang et al., "new CoSi$_2$ Salicide Technology for 0.1 µm Processes and Below", 1995 Symposium on VLSI Technology Digetst of Technical Papers, Jun. 6–8, 1995, pp. 17–18.

Q.F. Wang et al., "RTP Cobalt Salicidation As a Solution for 0.25 µm CMOS and Beyond", 4$^{th}$ Int'l Conf. on Advanced Thermal Processing of Semiconductors—RTP '96, Sep. 11–13, 1996, pp. 395–399.

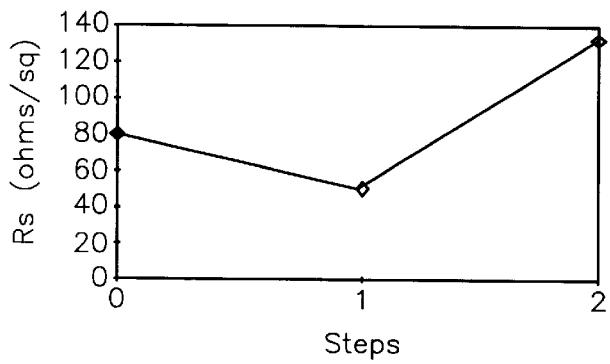
FIGURE 9A
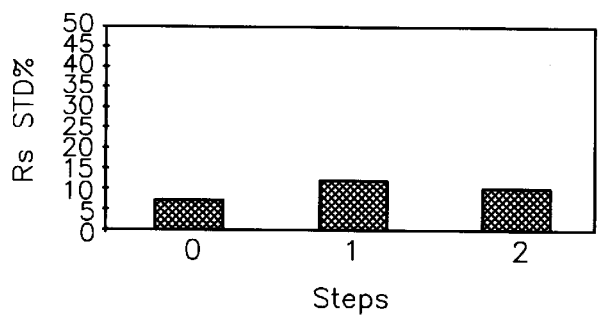
FIGURE 9B
FIGURE 9C
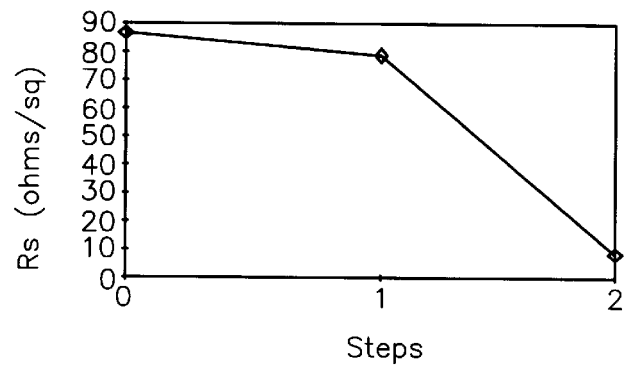
FIGURE 9D
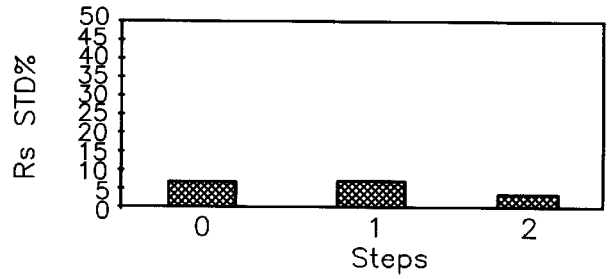

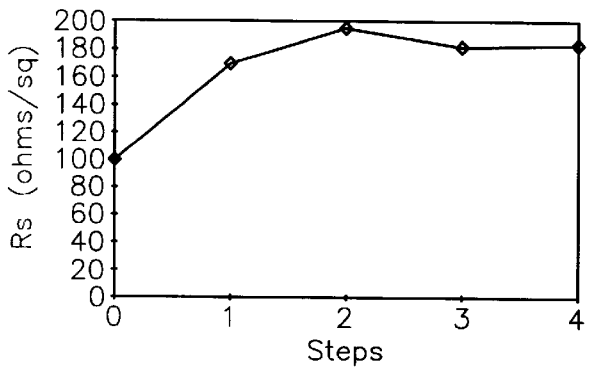
FIGURE 10A
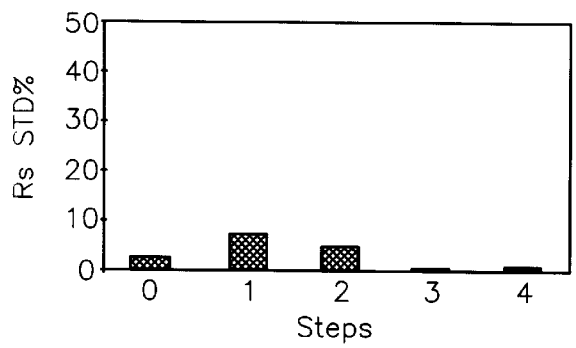
FIGURE 10B
FIGURE 10C
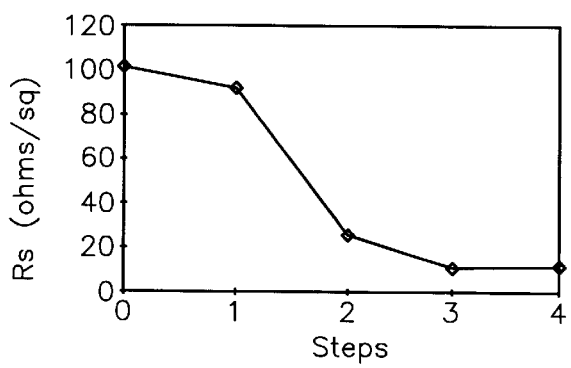
FIGURE 10D
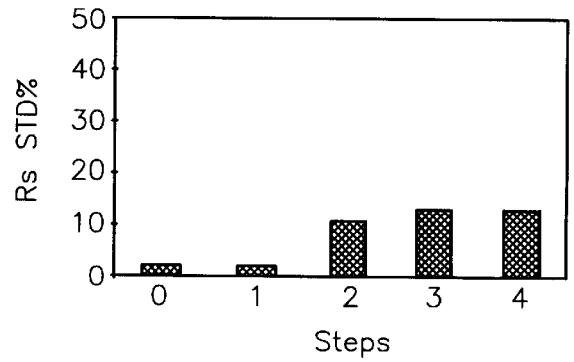

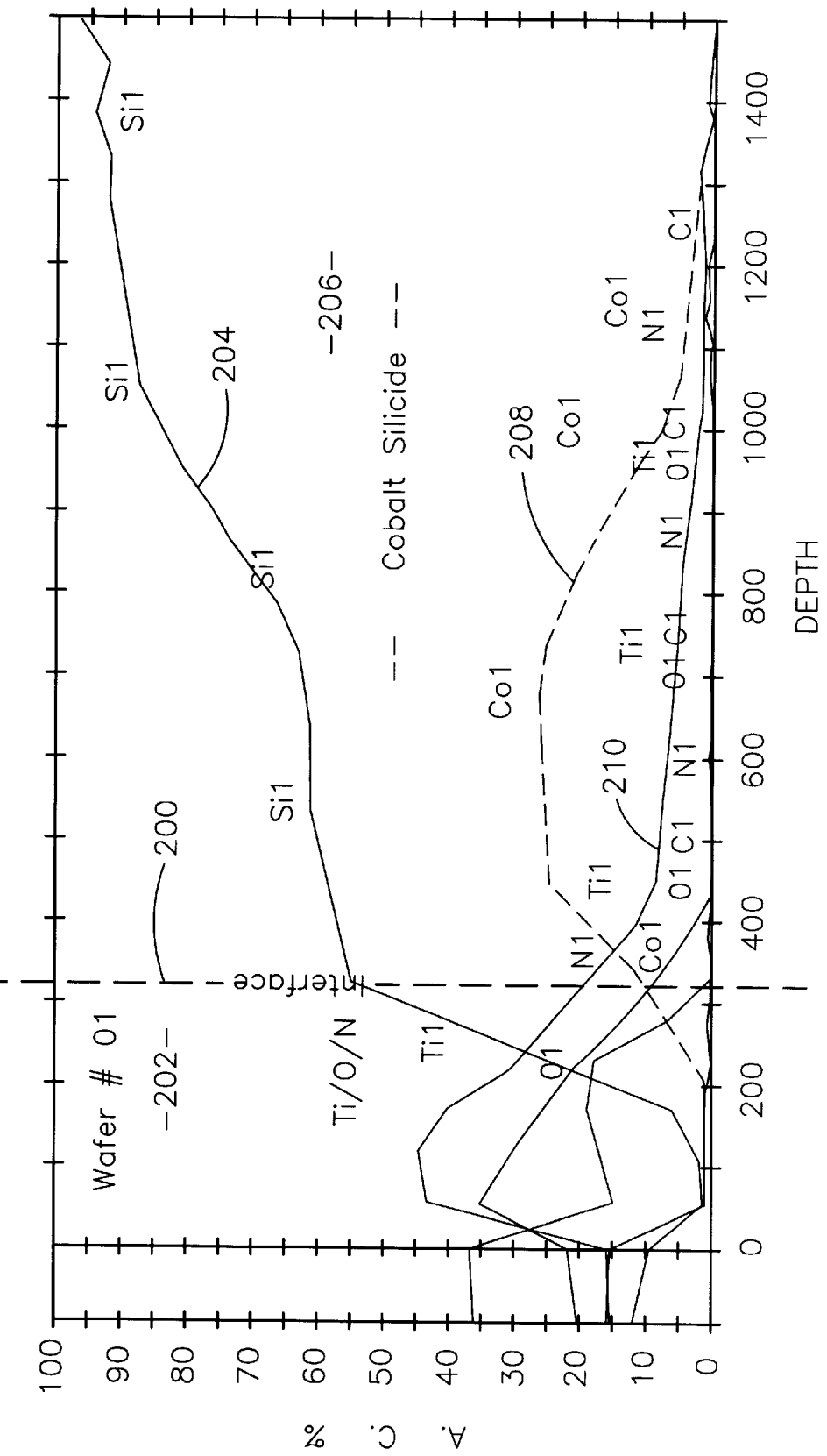

METAL SILICIDATION METHODS AND METHODS FOR USING SAME

FIELD OF THE INVENTION

The present invention relates to the fabrication of semiconductor devices. More particularly, the present invention relates to metal silicidation methods for silicidation using metals, such as, for example, cobalt.

BACKGROUND OF THE INVENTION

Various metalization, interconnect, and polycide formation processes are known and used in the fabrication of semiconductor devices. For example, in fabrication of static random access memories (SRAMs) or dynamic random access memories (DRAMs), local interconnects are used to increase packing density and metal suicides are used for metalization of contact junctions and for forming polycide lines, such as bit lines, word lines, or other local interconnection of device elements being fabricated. As line widths of semiconductor devices decrease, desire for low resistance polycides with low aspect ratios has led to the consideration of various polycide materials other than the conventional tungsten or titanium silicide. Further, for example, in the formation of shallow junction contacts, a desire for low resistivity materials for metalization of such junction contacts as an alternative to titanium silicide are also desired. As shallower junctions become utilized in, for example, memory device fabrication, the titanium thickness used in a silicidation process, must be reduced, which, in turn, undesirably increases the Kelvin contact resistance. This is because titanium silicide is a large grain material. Thin titanium silicide has nonuniform large grain size that contributes to a very rough titanium silicide/silicon interface. As such, it reduces the effective ohmic contact area. In order to use such lower resistivity materials, effective methods for forming such materials, such as cobalt silicide, need to be developed.

Cobalt silicide, or perhaps nickel silicide, in particular, due to their low bulk resistivity and small grain size, are well suited for use in various fabrication processes, such as, for example, shallow junction contact metalization processes or use in polycide structures, such as polycide word lines or bit lines. However, junction spiking at the cobalt silicide/silicon interface associated with the use of cobalt as the predominant diffusion species in a silicide process, tends to form spiking related pittings, i.e., voids in the cobalt silicide formed. Such pittings or voids are detrimental to the performance of devices fabricated with such a cobalt silicidation process as the pittings may penetrate through the shallow junction to cause junction leakage.

Further, dopants and impurities can diffuse out of cobalt silicide easily. As such, diffusion of impurities out of the cobalt towards the gate oxide of a device may occur. For example, diffusion of impurities, such as alkali metals, may occur in the metalization of a bit line contact during a cobalt silicidation anneal. Such diffusion of unwanted impurities into the gate region may also be detrimental to the devices being fabricated.

Various silicidation methods using cobalt are known. For example, in one such method, a layer of cobalt is deposited over silicon regions and then an anneal is performed to react the cobalt with the silicon to silicide the silicon regions with the formation of cobalt silicide.

In another silicidation method, titanium and then cobalt are deposited on a silicon region and then annealed. During the annealing process, the titanium reacts with the silicon region and then diffuses upward with the cobalt diffusing downward to silicide the silicon regions resulting in the formation of cobalt silicide. This method is known as a titanium/cobalt reversal silicidation process.

As is known and described in the article entitled, "Nitrogen-Doped Nickel Monosilicide Technique for Deep Submicron CMOS Salicide," by T. Ohguro, et al., *IEDM* (1995), pp. 453–456, the incorporation of small amounts of nitrogen into assputtered nickel film before salicidation can control spiking and improve leakage current. However, nickel, and also cobalt, do not easily react with nitrogen making such incorporation difficult. As such, incorporation of nitrogen into the nickel or cobalt must be performed with an undesirably large volume ratio of nitrogen during the deposition of the cobalt or nickel to incorporate a small amount of nitrogen in the cobalt or nickel silicide film.

However, one shortcoming associated with the nitridation of cobalt or nickel films to decrease junction pittings or voids, is that the difficulty of the silicidation process using such nitridated films increases with the increasing percentage of nitrogen incorporated therein. For example, the temperature of the anneal necessary for obtaining the same resistance for the silicidation process when utilizing cobalt or nickel films having increasing nitrogen concentrations, increases as well.

Accordingly, there is a need in the art for silicidation methods for forming, for example, polycide lines or metalization of contact holes, which overcome difficulties with the use of cobalt and nickel in the silicidation process. Such methods should decrease the potential for pitting during the silicidation process, more efficiently incorporate nitrogen into the cobalt or nickel for use in decreasing such spiking problems, and/or remove impurities of the cobalt or nickel film to decrease the likelihood of diffusion of unwanted impurities therefrom. The present invention overcomes problems described above and other problems as will become apparent to one skilled in the art from the description below.

SUMMARY OF THE INVENTION

A method in accordance with the present invention for use in the fabrication of semiconductor devices includes forming a layer of nitridated cobalt on a surface of a silicon region and forming a film cap including titanium over the layer of cobalt. A thermal treatment is then performed to form cobalt silicide from the layer of nitridated cobalt and at least a portion of the silicon region.

In one embodiment of the method, the formation of the film cap includes forming a thin cap of titanium or titanium nitride having a thickness less than about 15 nanometers. More preferably, the thickness of the thin cap is in the range of about 3 nanometers to about 5 nanometers.

In another embodiment of the method, the layer of nitridated cobalt is formed in an atmosphere including nitrogen and the nitrogen incorporated in the layer is a percentage volume of about 10% or less. In addition, the thermal treatment may be performed at a temperature less than about 900° C. to form the cobalt silicide from the layer of cobalt and at least a portion of the silicon region.

In yet another method according to the present invention, the method includes forming a titanium film over a surface of a silicon region in an atmosphere including at least one of nitrogen and oxygen. A layer of one of cobalt or nickel is formed over the titanium film. A thermal treatment is then performed for reversal and silicidation of the titanium film and the layer of cobalt or nickel to form cobalt silicide or nickel silicide.

In one embodiment of the method, the reversal and silicidation of the titanium film and the layer of cobalt or nickel includes performing an anneal to form at least a titanium silicide region from the titanium film and at least a portion of the silicon region. Thereafter, an additional anneal is performed to form cobalt silicide or nickel silicide from the layer of cobalt or nickel and at least a portion of the titanium silicide region and the silicon region.

In another embodiment of the invention, the atmosphere includes less than about 3% by volume of nitrogen. Preferably, the atmosphere includes nitrogen in the range of about 0.1% to about 1% by volume.

In yet another embodiment of the invention, the atmosphere includes less than about 10% by volume of oxygen. Preferably, the atmosphere includes oxygen in the range of about 0.01% to about 1% by volume.

In other methods according to the present invention, silicidation of a silicon contact area is performed and a polycide line is formed using methods similar to those described above.

BRIEF DESCRIPTION OF THE DRAWINGS

FIGS. 8A–8D, 9A–9D, and 10A–10D are graphs showing a comparison of sheet resistivity between silicidation processes with use of a titanium film cap versus without the use of a titanium film cap.

FIG. 11 is a diagram showing the concentrations of various materials of a silicided silicon region with the use of a titanium film cap.

DETAILED DESCRIPTION OF THE EMBODIMENTS

The present invention shall be generally described with reference to FIGS. 1A–1C, 2A–2D, and 3A–3D. Variations of silicidation processes are shown in each of these groups of figures. With the description as provided below, it is readily apparent to one skilled in the art that the various processes described with respect to each group of figures may be utilized alone as a separate process, with process steps from one substituted for process steps of the other, or in various configurations, with process steps of one used as additional process steps or in combination with the process steps of the other. For example, the silicidation process using a nitridated cobalt layer and a titanium film cap may utilize a reversal silicidation process as described below. Further, for example, a reversal silicidation process which provides for efficient incorporation of nitrogen or uses incorporation of oxygen for impurity removal may use a titanium film cap. As such, the present invention is not limited to the particular process steps of each group of figures as a standalone silicidation process, but is limited only as described in the accompanying claims.

Figure 1A:
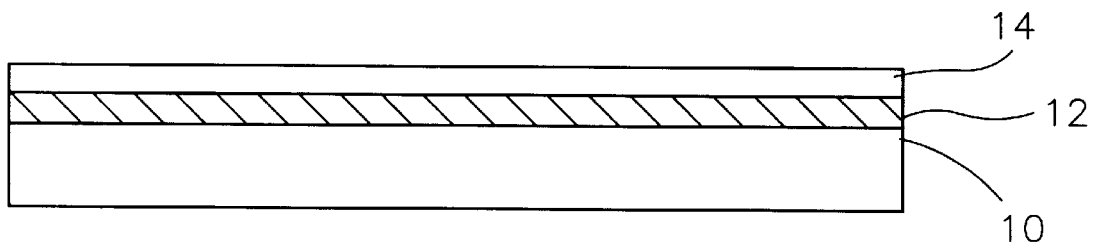
FIGS. 1A–1C are illustrative diagrams showing the steps of siliciding a silicon region using a titanium film cap and a nitridated cobalt layer in accordance with the present invention.
Figure 1B:
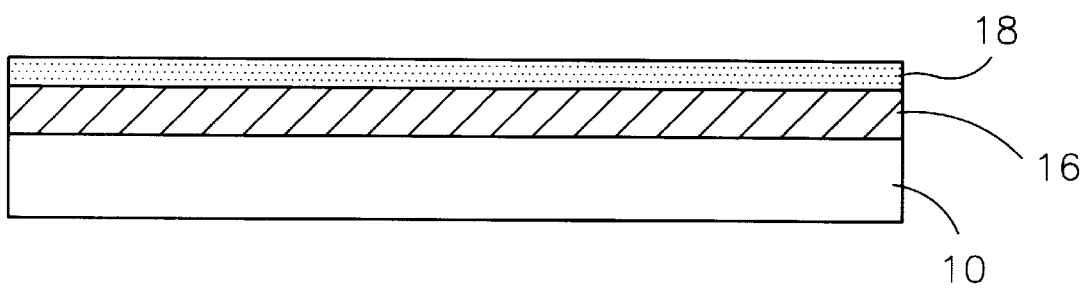
Figure 1C:
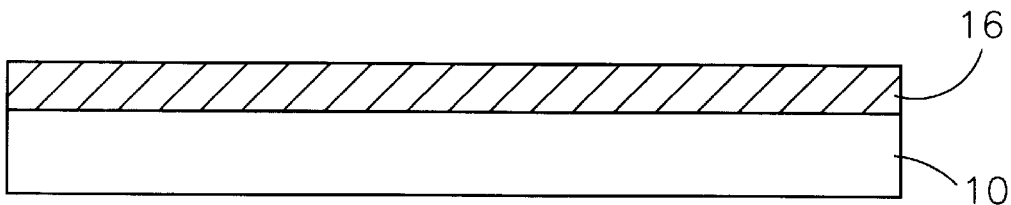

Generally, FIGS. 1A–1C show process steps of a method to effectively facilitate metal silicidation of a nitridated cobalt film by using a low temperature thin titanium film cap. With use of the titanium film cap the temperature at which the cobalt silicidation process can be performed is lowered relative to conventional cobalt silicidation processes. Further, nitridation during the deposition of a cobalt thin film in combination with a thin titanium film cap reduces the likelihood of spiking or the number of pittings or voids in the cobalt silicide film formed during the silicidation process.

Generally, FIGS. 2A–2D show process steps of a thin film gettering method to purify the cobalt silicide formed during a silicidation process. A stack of cobalt and titanium is formed over a silicon region, with or without a cap including titanium over the cobalt. The titanium deposited on the silicon region is deposited with a small volume of oxygen in the atmosphere which forms small amounts of titanium oxide in the titanium film. Two techniques are then used to achieve gettering, i.e., removal of impurities, and formation of the cobalt silicide. A snow plowing effect pushes light density titanium oxide towards the titanium/cobalt interface during a thermal treatment in which titanium silicide is formed. Thereafter, a thermal treatment is then used to perform a reversal of the titanium silicide and the cobalt to form the cobalt silicide over the silicon region. In this manner, the impurities are plowed to the upper portion of the stack, i.e., out of the formed cobalt silicide.

Generally, FIGS. 3A–3D show the process steps of efficiently and indirectly incorporating light concentrations of nitrogen into cobalt silicide formed during a silicidation process. Such light nitridation of the cobalt silicide improves leakage current through the reduction of spiking or pittings in the cobalt silicide formed. In the process, a stack of cobalt and titanium is formed over a silicon region, with or without a cap including titanium over the cobalt. The titanium deposited on the silicon region is deposited with a small volume of nitrogen in the atmosphere which incorporates small amounts of nitrogen in the preformed titanium film. During a first thermal treatment in which titanium silicide is formed, a low concentration of $TiN_x$ or $SiN_x$ remains in the titanium silicide. Thereafter, a thermal treatment is used to perform a reversal of the titanium silicide and the cobalt to form the cobalt silicide over the silicon region with the $TiN_x$ or $SiN_x$ remaining in the cobalt silicide.

As described in further detail with reference to FIGS. 1A–1C, the silicidation process as shown therein includes forming a cobalt layer 12 over a surface of a substrate assembly 10. Substrate assembly refers to a semiconductor substrate which includes a base layer of silicon material of the device being fabricated or a silicon layer formed on another material, such as, for example, silicon on sapphire. Further substrate assembly refers to a semiconductor substrate having one or more various layers formed thereon. In the method described with reference to FIGS. 1A–1C, the surface upon which cobalt layer 12 is deposited may include various surfaces, including but not limited to, a silicon containing surface of a silicon region (i.e., a doped or undoped silicon region for silicidation and metalization thereof), of a polysilicon region (i.e., a doped or undoped polysilicon region such as for formation of a polycide line), or of various other surfaces such as for interconnect between at least two elements of a device structure with a polycide line (i.e., drain to a bit line of a device). For example, in the formation of a polycide line, the cobalt may be deposited over a polysilicon layer which is formed over a gate oxide and field oxide regions of a device being formed as further described in the illustration provided below.

The cobalt layer 12 may be deposited at various thicknesses depending upon the application of the silicidation process and the desired resistance of the resulting cobalt silicide. For example, in the metalization of a contact junction, the thickness may be in the range of about 50 Å to about 150 Å.

Further, the cobalt may be deposited by various methods. For example, the cobalt layer 12 may be deposited, for example, by sputtering, evaporation, physical or chemical vapor deposition. For example, in a sputtering process for cobalt, the process may be performed by using an argon gas as the sputtering gas at a particular flow rate, with the application of an RF power for achieving the desired deposition in a pressurizable sputtering chamber. However, it should be readily apparent that any manner of forming the cobalt layer is contemplated in accordance with the present invention and is in no manner limited to any particular process, i.e., sputtering, for formation thereof.

The cobalt layer 12 is formed with the incorporation of a certain percentage of nitrogen therein. The percentage of nitrogen incorporated therein is preferably 10% or less by volume. For example, the incorporation of nitrogen into the cobalt layer may be performed by sputtering cobalt with use of an Argon sputtering gas in a MRC Eclipse PVD system available from MRC (Gilbert, Ariz.), in an atmosphere including nitrogen. With the incorporation of nitrogen into the cobalt layer 12, spiking related pittings or voids are reduced as is shown by the Examples below.

However, with the incorporation of larger amounts of nitrogen into the cobalt layer 12, the difficulty of performing the silicidation process is increased. For example, the amount of unreacted cobalt increases with nitridation even after high temperature anneals.

To combat the difficulty of the silicidation process using cobalt nitridated with large amounts of nitrogen, i.e., such as 10% nitrogen by volume, a titanium film cap 14 is formed over the cobalt layer 12. The titanium film cap 14 may be formed, for example, by sputtering, evaporation, physical vapor deposition or chemical vapor deposition. Although any thickness of the titanium film cap 14 may be used, preferably, the titanium cap 14 is formed to a thickness less than 15 nanometers, and more preferably, in the range of about 3 nanometers to about 5 nanometers. Further, the titanium film cap is preferably formed at a temperature of less than about 100° C. to improve layer to layer coverage of the titanium film cap 14 over the cobalt layer 12. As an alternative to a thin titanium cap being used, a thin titanium nitride cap may also be utilized.

As shown in FIG. 1B, the structure as shown in FIG. 1A is subjected to a silicidation anneal forming the cobalt silicide layer 16 over the silicon containing layer 10 and layer 18 which includes at least one of titanium, nitrogen, titanium oxide, titanium nitride, oxygen, and even unreacted cobalt. The anneal may be a rapid thermal process (RTP) anneal in the temperature range of about 500° C. to about 900° C. for about 10 to about 40 seconds. It should be apparent and as described in the Examples below, that the thermal treatment will vary depending upon various factors such as thickness of the cobalt layer, resistivity desired, etc. The thermal treatment may also be a conventional furnace anneal as opposed to an RTP anneal and further may include various anneal steps, whether furnace or RTP anneal, in temperature and duration.

After the silicidation anneal is performed resulting a silicided region including cobalt silicide layer 16, the layer 18 may be removed. For example, the layer 18 may be removed using any known stripping method for removing a titanium containing layer, whether dry or wet. For example, the strip may include a mixture of ammonia and hydrogen peroxide, or a mixture of sulfuric acid and hydrogen peroxide. Further, for example, layer 18 may be removed by a dry etch such as with utilization of a fluorine or chlorine containing plasma, such as $CF_4$, $SF_6$. The resulting layers, including cobalt silicide layer 16 and substrate or substrate assembly 10, are illustrated in FIG. 1C.

As shown by the Examples described below and the graphs of FIGS. 8A–8D, 9A–9D, and 10A–10D, the thin film cap including titanium and the incorporation of nitrogen in the cobalt layer improves the resistance values of the cobalt silicide formed by the silicidation process as it facilitates the silicidation process, i.e., decreases the amount of unreacted cobalt. These results occur even when the nitrogen incorporated is low.

It is believed that the results obtained using the titanium film cap are caused by the diffusion of a small amount of titanium into the cobalt film. With the titanium atoms diffused into the cobalt or cobalt silicide grain boundaries, particularly when the anneal is being performed and since silicon is the predominant diffusion species in titanium silicidation processes, the silicon is further drawn upward towards the titanium atoms through the cobalt layer 12 to facilitate the silicidation of the cobalt layer 12.

The following examples are used to point out the beneficial effects of using a titanium film cap 14 in the silicidation of nitridated cobalt layer 12. In each of the examples, the formation of a cobalt layer over HF dipped silicon wafers, and the formation of the titanium film cap, if applicable, were performed using a MRC Eclipse PVD system available from MRC, (Gilbert, Ariz.) using an Argon sputtering gas. In each particular example, the various different characteristics of the example will be noted, i.e, thickness of cobalt deposited, temperatures of the anneals, etc.

The sheet resistance measurements taken were performed by using Omnimap available from Tencor Instruments (Mountain View, Calif.).

EXAMPLE 1

Figure 6A:
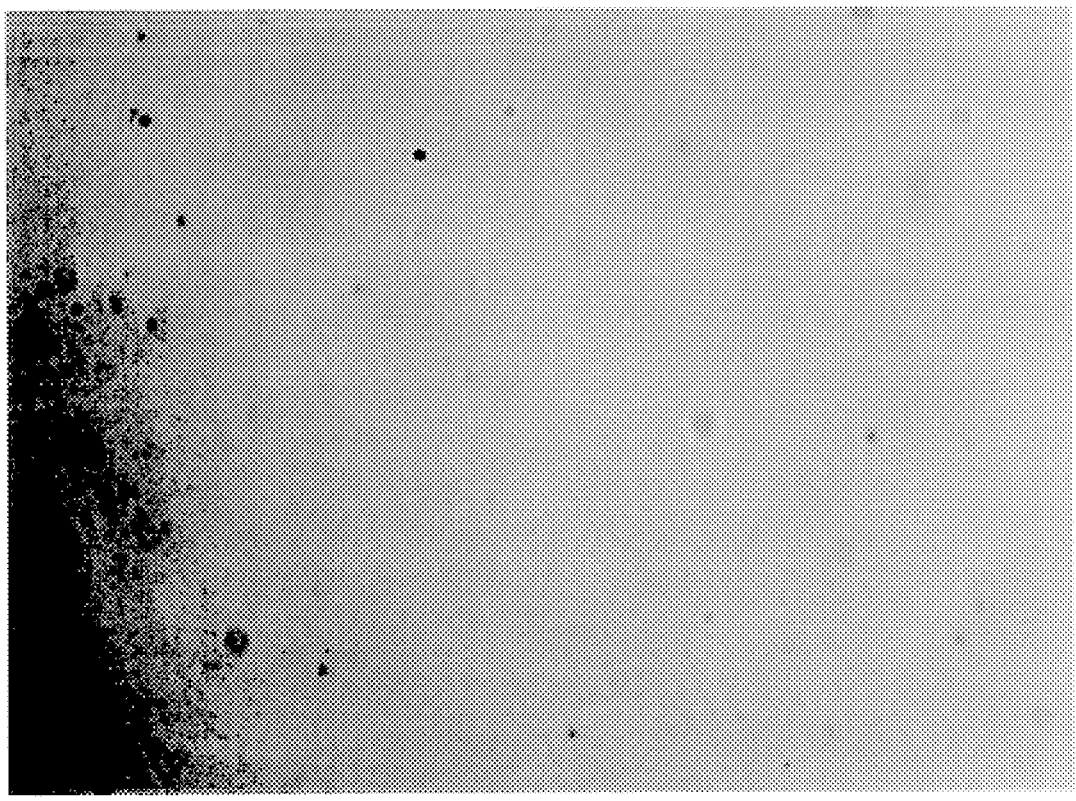
FIGS. 6A–6B are images showing pittings or voids of silicided silicon using cobalt without a titanium film cap.
Figure 6B:
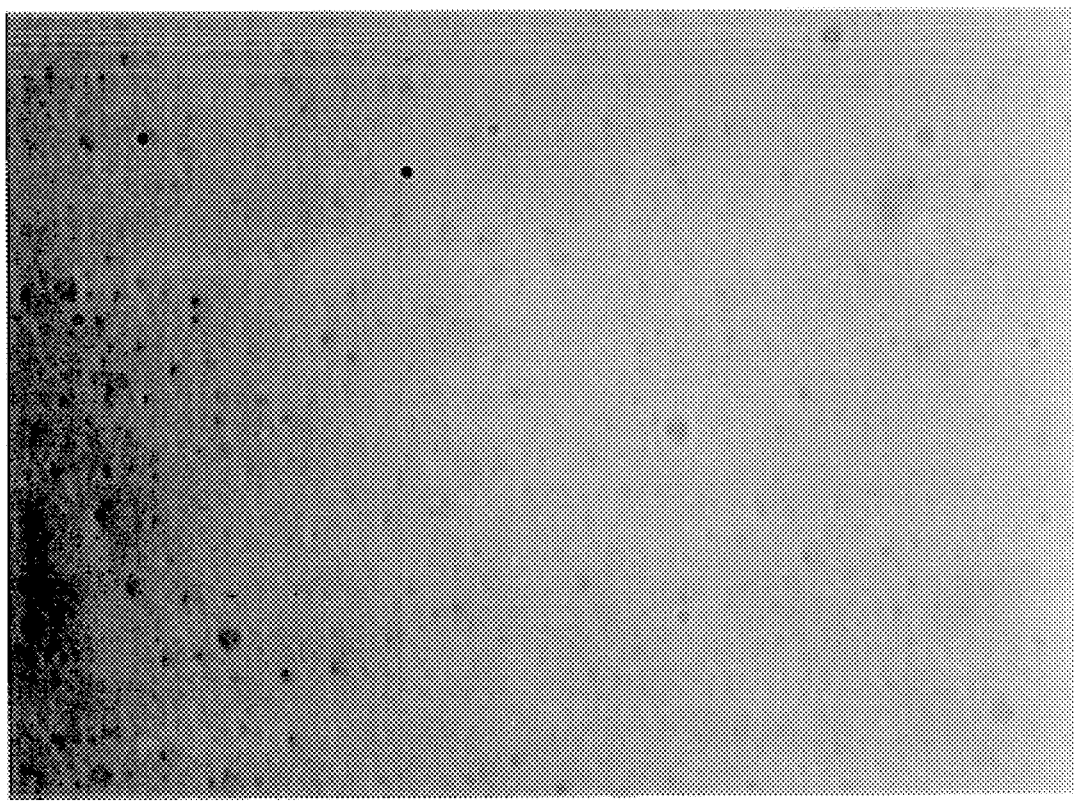

As shown in FIGS. 6A–6B and FIGS. 7A–7B, three wafers, wafer1–3, were run at slightly different parameters and with various characteristics. FIGS. 6A and 6B are Normarsky images of wafer1. Wafer1 included an HF dipped silicon wafer with an unnitridated layer of cobalt formed thereon at a thickness of about 75 Å. A silicidation RTP anneal at about 630° C. was performed for about 20 seconds in a nitrogen atmosphere. No titanium film cap was utilized.

As shown in FIGS. 6A and 6B, the wafer1 contained a significant number of pittings or voids (the larger darker areas are believed to be lens blurs). FIG. 6A is an image at the center of the wafer1 and FIG. 6B is an image at an edge of the wafer1.

Figure 7A:
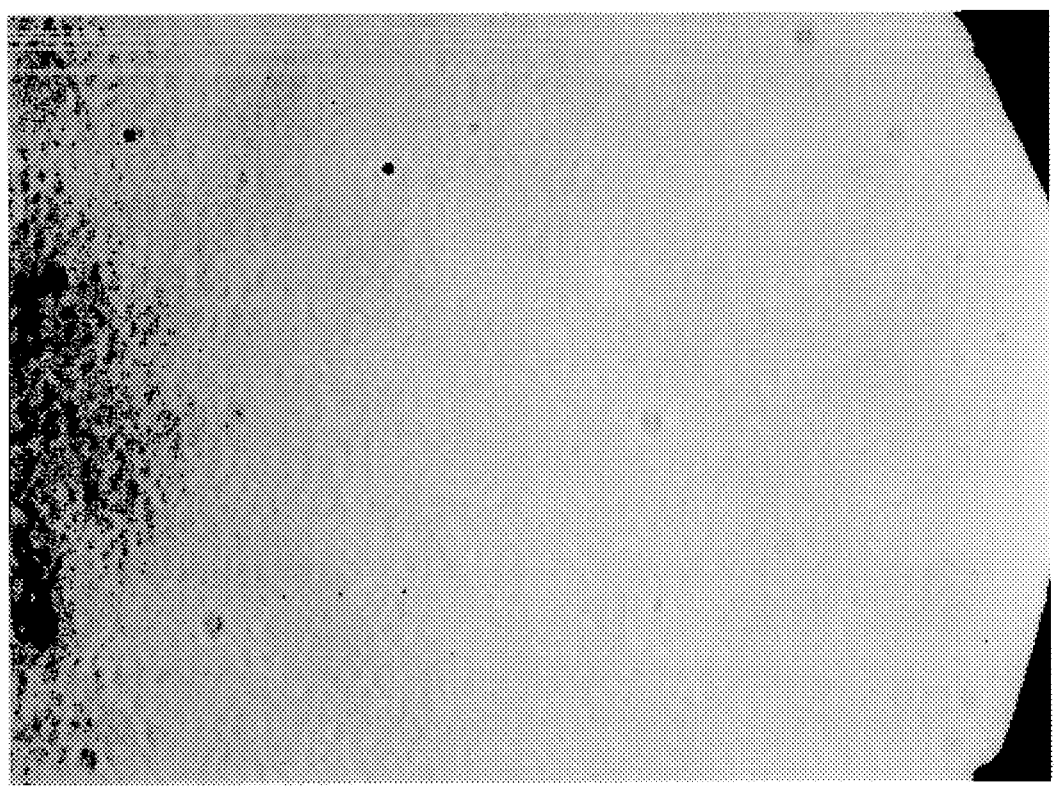
FIGS. 7A–7B are images showing a virtual absence of pittings or voids of silicided silicon using cobalt with a titanium film cap.

FIG. 7A is a Normarsky image of wafer2. Wafer2 included an HF dipped silicon wafer with a nitridated layer of cobalt formed thereon at a thickness of about 88 Å. The percentage of nitrogen incorporated into the film was about 5%. A titanium film cap of about 5 nanometers at about 100° C. was formed over the cobalt layer. A silicidation RTP anneal at about 700° C. was performed for about 15 seconds in a nitrogen atmosphere.

As shown in FIG. 7A, the wafer2 contained virtually no pittings or voids. FIG. 7A is an image at the center of the wafer2. An image at the edge of the wafer was insignificantly different, containing virtually no pittings or voids.

Figure 7B:
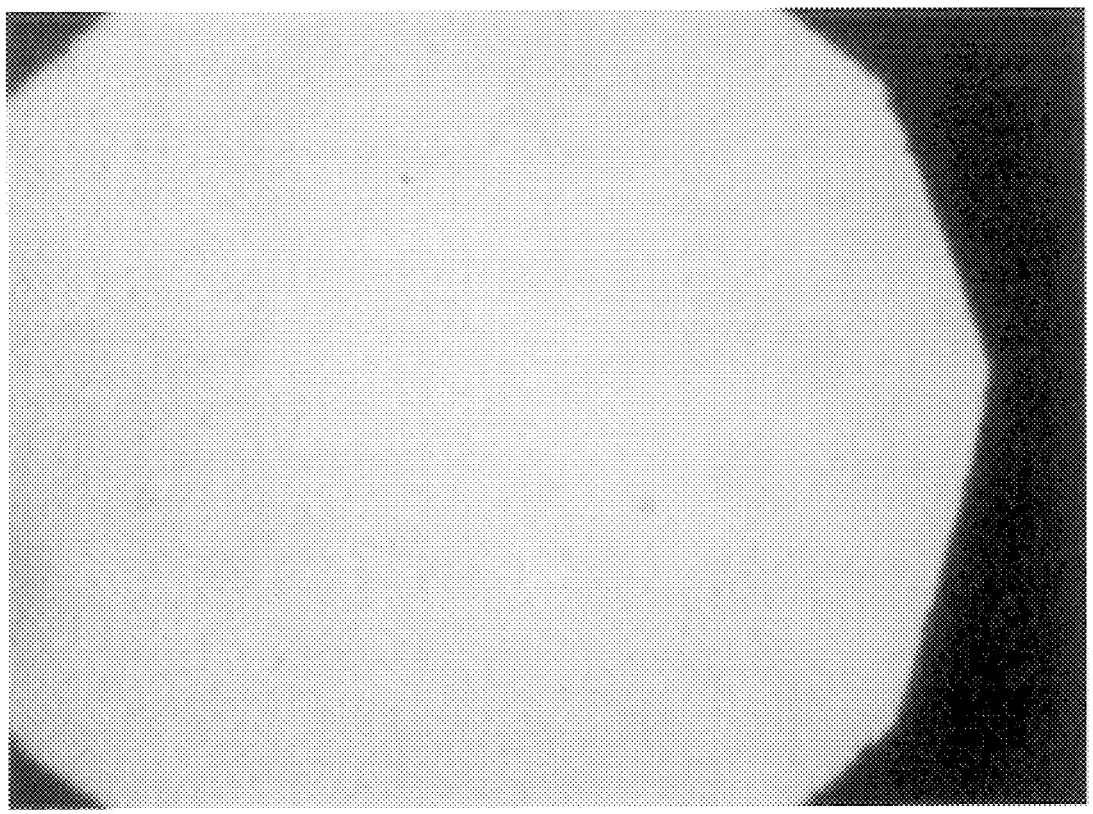

FIG. 7B is a Normarsky image of wafer3. Wafer3 included an HF dipped silicon wafer with a nitridated layer of cobalt formed thereon at a thickness of about 105 Å. The percentage of nitrogen incorporated into the film was about 10%. A titanium film cap was not utilized. A silicidation RTP anneal at about 700° C. was performed for about 15 seconds in a nitrogen atmosphere.

As shown in FIG. 7B, the wafer3 contained virtually no pittings or voids. FIG. 7B is an image at the center of the wafer3. However, there was a very small amount of the cobalt reacted with the silicon, and therefore, unusable as a silicidation process.

The images generally show the reduction of pittings using a film cap including titanium for the silicidation of nitridated cobalt, i.e., nitrogen incorporated at a volume of about 5%, which is further substantiated by the examples that follow.

EXAMPLE 2

As shown in FIGS. 8A–8D, eight wafers were initially prepared, e.g., Step 0, with substantially equivalent characteristics and parameters. The wafers were initially HF dipped silicon wafers with an unnitridated layer of cobalt formed thereon at a temperature of about 100° C. and a thickness of about 75 Å.

Four wafers were then processed according to the following steps, i.e., without a titanium film cap. Step 1: a silicidation RTP anneal at about 630° C. was performed for about 20 seconds in a nitrogen atmosphere; Step 2: a silicidation RTP anneal at about 700° C. was performed for about 15 seconds in a nitrogen atmosphere; Step 3: a silicidation RTP anneal at about 730° C. was performed for about 10 seconds in a nitrogen atmosphere; Step 4: a silicidation RTP anneal at about 765° C. was performed for about 30 seconds in a nitrogen atmosphere.

Figure 8A:
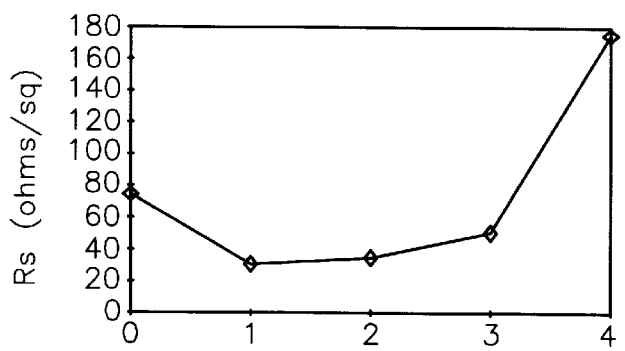
Figure 8B:
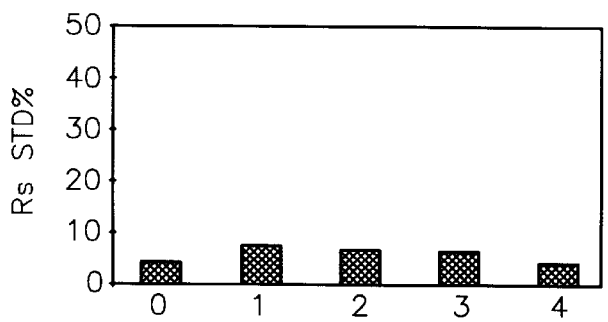

As shown in FIGS. 8A and 8B, resistance measurements were taken as described above at the completion of each step. FIG. 8A shows the resistance values in ohms/square and FIG. 8B shows the standard deviation of the resistance measurements from center to edge of wafers measured.

Four wafers were also processed according to the following steps, i.e., with a titanium film cap. Step 1: a titanium film cap of about 5 nanometers in thickness was deposited at a temperature of about 100° C.; Step 2: a silicidation RTP anneal at about 700° C. was performed for about 15 seconds in a nitrogen atmosphere; Step 3: a silicidation RTP anneal at about 850° C. was performed for about 30 seconds in a nitrogen atmosphere.

Figure 8C:
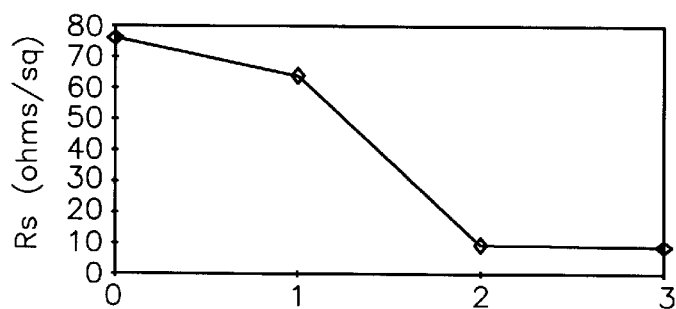
Figure 8D:
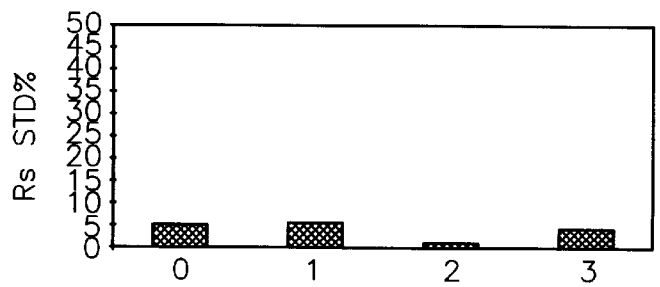

As shown in FIGS. 8C and 8D, resistance measurements were taken as described above at the completion of each step. FIG. 8C shows the resistance values in ohms/square and FIG. 8D shows the standard deviation of the resistance measurements from center to edge of wafers measured.

EXAMPLE 3

As shown in FIGS. 9A–9D, eight wafers were initially prepared, e.g., Step 0, with substantially equivalent characteristics and parameters. The wafers were initially HF dipped silicon wafers with a nitridated layer of cobalt formed thereon at a temperature of about 100° C. and a thickness of about 88 Å. The percentage of nitrogen incorporated into the cobalt film was about 5%.

Four wafers were then processed according to the following steps, i.e., without a titanium film cap. Step 1: a silicidation RTP anneal at about 700° C. was performed for about 15 seconds in a nitrogen atmosphere; Step 2: a silicidation RTP anneal at about 765° C. was performed for about 30 seconds in a nitrogen atmosphere.

As shown in FIGS. 9A and 9B, resistance measurements were taken as described above at the completion of each step. FIG. 9A shows the resistance values in ohms/square and FIG. 9B shows the standard deviation of the resistance measurements from the center to edge of wafers measured.

Four wafers were also processed according to the following steps, i.e., with a titanium film cap. Step 1: a titanium film cap of about 5 nanometers in thickness was deposited at a temperature of about 100° C.; Step 2: a silicidation RTP anneal at about 700° C. was performed for about 15 seconds in a nitrogen atmosphere.

As shown in FIGS. 9C and 9D, resistance measurements were taken as described above at the completion of each step. FIG. 9C shows the resistance values in ohms/square and FIG. 9D shows the standard deviation of the resistance measurements from center to edge of wafers measured.

EXAMPLE 4

As shown in FIGS. 10A–10D, eight wafers were initially prepared, e.g., Step 0, with substantially equivalent characteristics and parameters. The wafers were initially HF dipped silicon wafers with a nitridated layer of cobalt formed thereon at a temperature of about 100° C. and a thickness of about 105 Å. The percentage of nitrogen incorporated into the cobalt film was about 10%.

Four wafers were then processed according to the following steps, i.e., without a titanium film cap. Step 1: a silicidation RTP anneal at about 700° C. was performed for about 15 seconds in a nitrogen atmosphere; Step 2: a silicidation RTP anneal at about 765° C. was performed for about 30 seconds in a nitrogen atmosphere; Step 3: a silicidation RTP anneal at about 850° C. was performed for about 30 seconds in a nitrogen atmosphere; Step 4: a silicidation RTP anneal at about 880° C. was performed for about 30 seconds in a nitrogen atmosphere.

As shown in FIGS. 10A and 10B, resistance measurements were taken as described above at the completion of each step. FIG. 10A shows the resistance values in ohms/square and FIG. 10B shows the standard deviation of the resistance measurements from center to edge of wafers measured.

Four wafers were also processed according to the following steps, i.e., with a titanium film cap. Step 1: a titanium film cap of about 5 nanometers in thickness was deposited at a temperature of about 100° C.; Step 2: a silicidation RTP anneal at about 700° C. was performed for about 15 seconds in a nitrogen atmosphere; Step 3: a silicidation RTP anneal at about 765° C. was performed for about 30 seconds in a nitrogen atmosphere; Step 4: a silicidation RTP anneal at about 850° C. was performed for about 30 seconds in a nitrogen atmosphere.

As shown in FIGS. 10C and 10D, resistance measurements were taken as described above at the completion of each step. FIG. 10C shows the resistance values in ohms/ square and FIG. 10D shows the standard deviation of the resistance measurements from center to edge of wafers measured.

As shown by the FIGS. 8A, 9A, 10A, which show an increasing percentage of nitrogen in the cobalt film without the use of a titanium cap, the difficulty in performing the silicidation process increases. For example, as shown by FIG. 10A, the silicidation that occurs with the use of 10% cobalt is so little that the resistance remains above 180 ohms/square even after an anneal above 850° C.

As shown by FIG. 10C, the resistance drops to about 11 ohms/square for a 10% nitridated cobalt layer with a titanium film cap used thereover. This is in direct comparison to the 180 ohms/square for such a nitridated layer as shown in FIG. 10A. Such an improvement is also shown at lower nitridation levels. For example, as shown in FIGS. 9A and 9C, at 5% nitridation of the cobalt layer sheet resistance is improved from about 48 ohms/square to about 8 ohms/square after the same 700° C. anneal. Further, for example, as shown in FIGS. 8A and 8C, the sheet resistance drops from about 34 ohms/square to about 9 ohms/square after the same 700° C. anneal with the use of a titanium film cap on an unnitridated layer of cobalt.

In addition, the thermal stability of the cobalt silicide is demonstrated from the above Examples. For example, when comparing FIGS. 8A and 8C, the addition of a thin titanium film cap shows such stability. In FIG. 8A, without the film cap, the cobalt silicide becomes unstable for an RTP anneal above 750° C. while the sheet resistance remains virtually unchanged when the cobalt film is capped even after an 850° C. anneal (FIG. 8C).

EXAMPLE 5

The results of the Examples above are further confirmed by the XPS analysis performed with respect to a single wafer as shown in the results of FIG. 11. One silicon wafer was HF dipped and a cobalt layer was formed thereon at a thickness of about 100 Å. A titanium film cap of about 15 nanometers at about 100° C. was formed over the cobalt layer. A silicidation RTP anneal at about 825° C. was performed for about 30 seconds in a nitrogen atmosphere.

As shown in the concentration profile of FIG. 11, the interface between the cobalt silicide region 206 and titanium film region 202 is shown by line 200. It is readily apparent that the titanium cap is still in place as shown by the high titanium concentration at a depth from 0 to 200 Å. It is shown from the profile that titanium atoms are distributed in the cobalt silicide and cobalt by diffusion of the titanium therein. The silicon content is shown by line 204, the cobalt content by line 208, and the titanium content by line 210. The other lines represent the small concentrations of oxygen, carbon, and nitrogen. The sheet resistance of the structure was measured at about 9.5 ohms/square and a standard deviation of about 4%.

With reference to FIGS. 2A–2D, a silicidation process which getters out unneeded impurities from deposited cobalt used in a titaniumcobalt silicidation and reversal process is described. The silicidation process includes forming a titanium layer 22 and then a cobalt layer 24 over a surface of a substrate assembly 20 (FIG. 2A) which includes by definition a semiconductor substrate. In the silicidation process described with reference to FIGS. 2A–2D, the surface upon which cobalt layer 24 is deposited is a titanium surface. The titanium surface is therefore formed on a surface of a silicon region (i.e., a doped or undoped silicon region for silicidation and metalization thereof), a polysilicon region (i.e., a doped or undoped polysilicon region such as for formation of a polycide line), or various other surfaces such as for interconnect between at least two elements of a device structure such as with a polycide line (i.e., drain to a bit line of a device) and can be considered part of the substrate assembly upon which the cobalt layer 24 is formed.

The titanium film 22 may be formed, for example, by sputtering, evaporation, physical vapor deposition or chemical vapor deposition. Although any thickness of the titanium film 22 which is less than the thickness of cobalt layer 24 may be used, preferably, the titanium film is very thin, i.e., in the range of about 0.5 to about 10 nanometers.

The cobalt layer 24 may be deposited at various thicknesses depending upon the application of the silicidation process and the desired resistance of the resulting cobalt silicide. For example, in the metalization of a contact junction, the thickness may be in the range of about 50 Å to about 150 Å. Further, the cobalt layer 24 may be formed by various methods. For example, the cobalt layer 24 may be formed by sputtering, evaporation, physical or chemical vapor deposition. Further, for example, in a sputtering process for cobalt, the process may be performed by using an argon gas as the sputtering gas at a particular flow rate, with the application of an RF power for achieving the desired deposition in a sputtering chamber. However, it should be readily apparent that any manner of forming the cobalt layer is contemplated in accordance with the present invention and is in no manner limited to any particular process, i.e., sputtering, for formation thereof.

The titanium layer 22 is formed in an atmosphere including oxygen for the formation of a light density of $TiO_x$ in the titanium film 22 formed. For example, the volume of oxygen in the atmosphere during the formation of the titanium layer 22 may include a volume of oxygen less than about 10% with the remaining volume being the sputtering gas, such as argon. Preferably, the volume of oxygen in the formation atmosphere is in the range of 0.01% to 1% by volume.

A titanium cap or titanium nitride cap 26 may also be formed on the stack of titanium and cobalt. Such a cap 26 eliminates the oxidation of the cobalt and provides benefits of a nature described with respect to FIGS. 1A–1C. However, the cap 26 need not be utilized to achieve the gettering effect as described with respect to FIGS. 2A–2D.

Figure 2A:
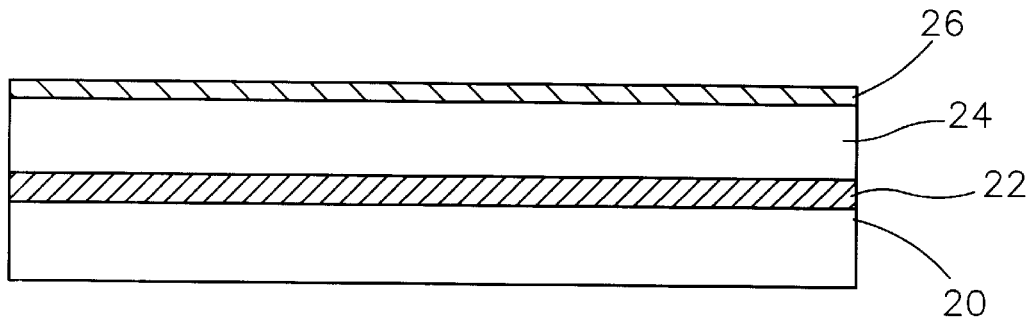
FIGS. 2A–2D are illustrative diagrams showing the steps of siliciding a silicon region using a layer reversal step and incorporation of oxygen into one of the layers reversed in accordance with the present invention.
Figure 2B:
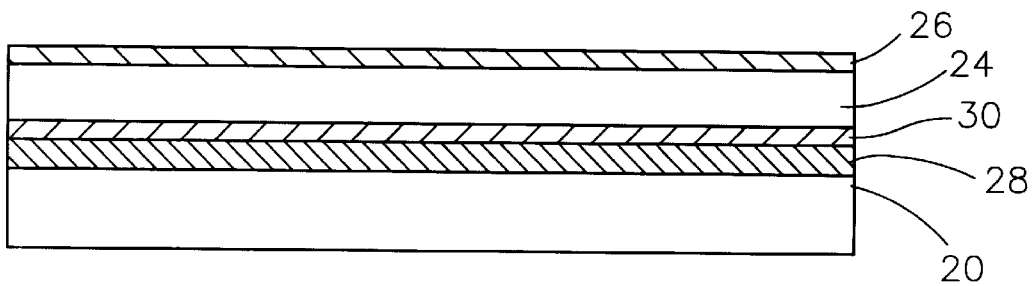

After at least the cobalt layer 24 is formed, two mechanistic steps are used to achieve gettering of the impurities and to form the cobalt silicide. First, the structure as shown in FIG. 2A is subjected to an anneal resulting-in the structure as shown in FIG. 2B. The first anneal may be performed at a temperature in the range of about 600° C. to about 750° C. typically for a duration of about 10 to about 30 seconds in a nitrogen atmosphere. During such an RTP anneal, titanium silicide 28 being formed advances upwards as titanium silicidation progresses.

During this RTP anneal, a snow plowing process plows any of the light density $TiO_x$ in the titanium film 22 upwards towards the initial titanium and cobalt interface as the reaction of titanium and silicon is more favored than that of titanium and oxygen. As a result, a uniform distribution of $TiO_x$ 30 is formed at the grain boundaries at the upper portion of the titanium silicide layer 28.

Figure 2C:
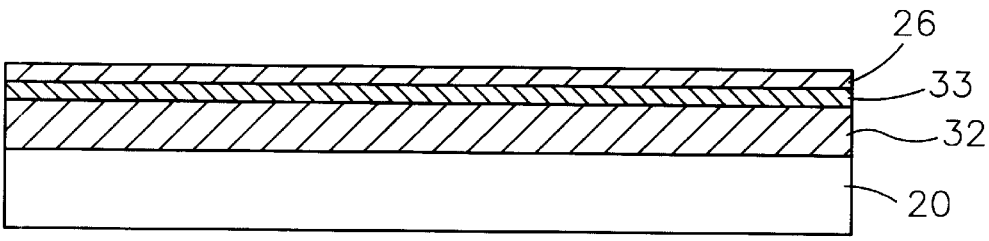

Another RTP anneal is then performed to perform a reversal silicidation of the titanium and cobalt as shown in FIG. 2C. For example, the anneal may be performed at a temperature in the range of about 750° C. to about 900° C. for about 10 to 30 seconds. During this reversal and silicidation anneal, the cobalt layer 24 diffuses through grain boundaries of $TiO_x$ 30 and grabs the silicon from the titanium silicide 28 to form the cobalt silicide layer 32. This occurs as the reaction of cobalt with silicon is preferred to the reaction of titanium with silicon.

As the uniform distribution of $TiO_x$ is advanced upward to the cobalt 24 and titanium silicide 28 interface and the cobalt 24 is required to diffuse through the uniform distribution of $TiO_x$ 30, the cobalt silicide 32 is purified. Any impurities such as carbon or metallic ions are plowed to the layer 33 as shown in FIG. 2C.

Figure 2D:
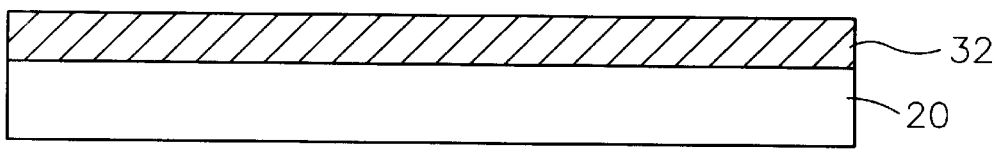

After the reversal and silicidation anneal is performed resulting in a silicided region including cobalt silicide layer 32, the layer 33 as well as cap 26, if utilized, may be removed. For example, the layer 33 may be removed using any known stripping method for removing a titanium containing layer, whether dry or wet as described above with respect to FIGS. 1A–1C. The resulting structure, including the cobalt silicide 32 and the substrate or substrate assembly 20, is shown in FIG. 2D.

With reference to FIGS. 3A–3D, a silicidation process which efficiently incorporates nitrogen into the formed cobalt silicide in a titaniumcobalt silicidation 30 and reversal process to reduce spiking during the silicidation process is described. The silicidation process includes forming a titanium layer 42 and then a cobalt layer 44 over a surface of a substrate assembly 40 (FIG. 3A), which by definition includes a semiconductor substrate. In the silicidation process described with reference to FIGS. 3A–3D, the surface upon which cobalt layer 44 is deposited is a titanium surface. The titanium is therefore formed on a surface of a silicon region (i.e., a doped or undoped silicon region for silicidation and metalization thereof), a polysilicon region (i.e., a doped or undoped polysilicon region such as for formation of a polycide line), or various other surfaces such as for interconnect between at least two elements of a device structure such as with a polycide line (i.e., drain to a bit line of a device) and can be considered part of the substrate assembly upon which the cobalt layer 44 is formed.

The titanium film 42 may be formed, for example, by sputtering, evaporation, physical vapor deposition or chemical vapor deposition. The thickness of the titanium film 42 is less than or equal to about 50% of the thickness of the later formed cobalt layer 44. Preferably, the titanium film is very thin, i.e., in the range of about 0.5 to about 10 nanometers.

The cobalt layer 44 may be deposited at various thicknesses depending upon the application of the silicidation process and the desired resistance of the resulting cobalt silicide. For example, in the metalization of a contact junction, the thickness may be in the range of about 50 Å to about 150 Å. Further, the cobalt layer 44 may be formed by various methods. For example, the cobalt layer 44 may be formed by sputtering, evaporation, physical or chemical vapor deposition. Further, for example, in a sputtering process for cobalt, the process may be performed by using an argon gas as the sputtering gas at a particular flow rate, with the application of an RF power for achieving the desired deposition in a sputtering chamber. However, it should be readily apparent that any manner of forming the cobalt layer is contemplated in accordance with the present invention and is in no manner limited to any particular process, i.e., sputtering, for formation thereof.

In one particular manner of forming the cobalt layer for metalization of a contact junction or any other of the processes described, magnetized cobalt is combined with the use of a "bucking" magnet system such as Varian Associates $MB^2$ tool or Applied Materials Endura tools. In this manner, collimated sputtering can be performed.

The titanium layer 42 is formed in an atmosphere including nitrogen for incorporation of the nitrogen into the titanium film 42. The nitrogen is easily incorporated into the titanium film and can uniformly incorporate as much as 23% atomic weight of nitrogen depending on the temperature. For example, the volume of nitrogen in the atmosphere during the formation of the titanium layer 22 may include a volume less than 3%. with the remaining volume being the sputtering gas, such as argon. Preferably, the volume of nitrogen in the formation atmosphere is in the range of 0.01% to 1%.

A titanium cap or titanium nitride cap 46 may also be formed on the stack of titanium and cobalt as described with reference to FIGS. 2A–2D. However, the cap 46 need not be utilized to achieve the efficient incorporation of nitrogen into the cobalt silicide formed during the silicidation and reversal process as described with respect to FIGS. 3A–3D.

Figure 3A:
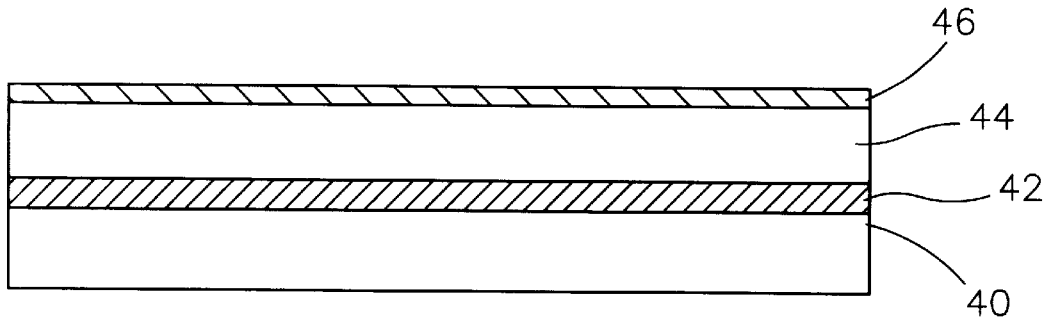
FIGS. 3A–3D are illustrative diagrams showing the steps of siliciding a silicon region using a layer reversal step and incorporation of nitrogen into one of the layers reversed in accordance with the present invention.
Figure 3B:
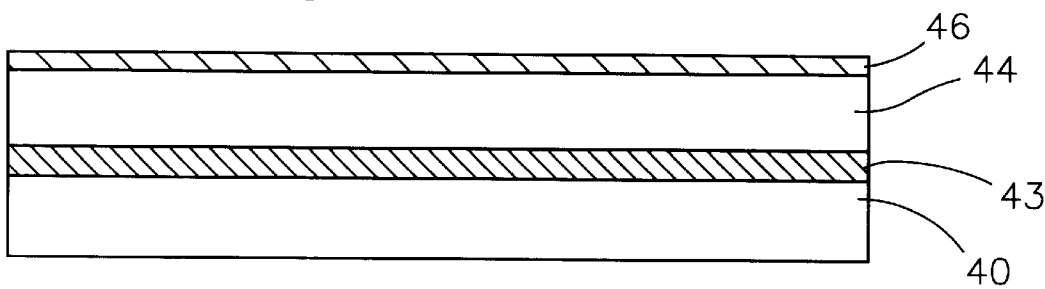

After at least the cobalt layer 44 is formed, two mechanistic steps are used to achieve the incorporation of nitrogen into the cobalt silicide being formed. First, the structure as shown in FIG. 3A is subjected to an anneal resulting in the structure as shown in FIG. 3B. The first anneal may be a performed at a temperature in the range of about 600° C. to about 750° C. typically for a duration of about 10 to about 30 seconds in a nitrogen atmosphere. During such an RTP anneal, titanium silicide 43 being formed advances upwards as titanium silicidation progresses. During this RTP anneal, a uniform, low concentration matrix of $TiN_x$ or $SiN_x$ remains in the titanium silicide layer 43 since titanium silicidation cannot reduce the nitride.

Figure 3C:
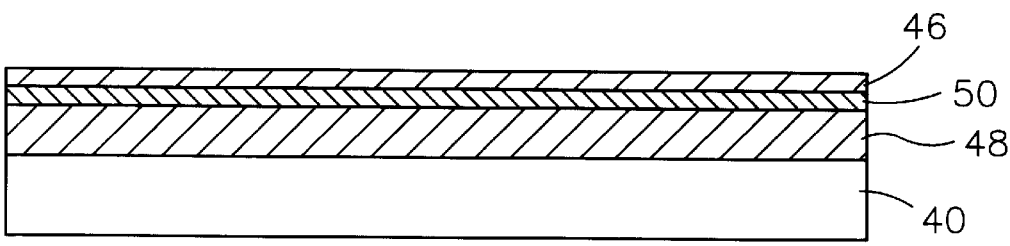

Another RTP anneal is then performed to perform a reversal silicidation of the titanium and cobalt as shown in FIG. 3C. For example, the anneal may be performed at a temperature in the range of about 750° C. to about 900° C. for about 10 to 30 seconds. During this reversal and silicidation anneal, the cobalt layer 44 grabs the silicon from the titanium silicide 43 to form the cobalt silicide layer 48. This occurs as the reaction of cobalt with silicon is preferred to the reaction of titanium with silicon. The remaining titanium atoms segregate to the top of the cobalt silicide film 48 as shown by layer 50 (FIG. 3C) because of the larger atomic size of titanium atoms. In this manner, light nitridation is first uniformly incorporated into the titanium silicide and then into the cobalt silicide film. The uniformity of the nitridation in the cobalt silicide is substantially maintained because the cobalt also cannot reduce the $TiN_x$ or $SiN_x$ matrix.

Figure 3D:
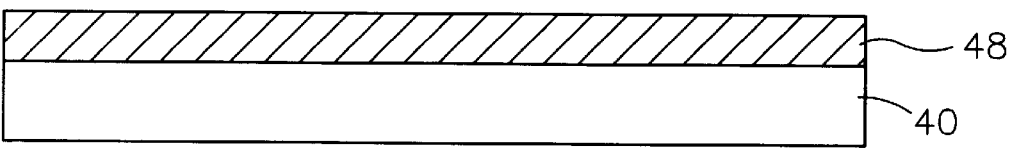

After the reversal and silicidation anneal is performed resulting in a silicided region including cobalt silicide layer 48, the layer 50 may be removed, as well as cap 46 if utilized. For example, the layer 50 may be removed using any known stripping method for removing a titanium containing layer, whether dry or wet as described above with respect to FIGS. 1A–1C. The resulting structure, including cobalt silicide 48 and substrate or substrate assembly 40, is shown in FIG. 3D.

Two illustrations of using the above described silicidation processes are described below with reference to FIGS. 4A–4D and FIGS. 5A–5D. The metalization of a contact junction in accordance with the present invention is described with reference to FIGS. 4A–4D. Further, the formation of a polycide line in accordance with the present invention is described with reference to FIGS. 5A–5D. For simplicity purposes, the illustrative descriptions are limited to the use of a titanium film cap process using nitridated cobalt in the silicidation process such as described with reference to FIGS. 1A–1C. However, it is readily apparent that the other processes as described with respect to FIGS. 2A–2D and 3A–3D can be likewise applied to the formation of such illustrative structures. Further, there are other semiconductor processes for various devices, i.e., CMOS devices, memory devices, etc., that would benefit from the present invention and in no manner is the present invention limited to the illustrative embodiments described herein, i.e, metalization and polycide line formation.

Figure 4A:
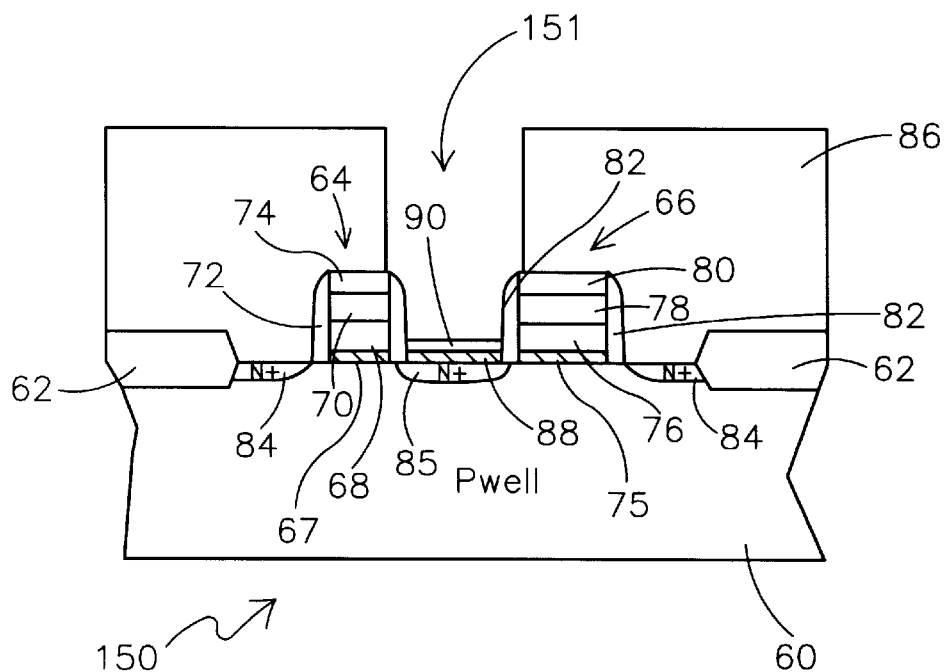
FIGS. 4A–4D are illustrative diagrams showing the metalization of a junction contact in accordance with the present invention.

As shown in FIG. 4A, device structure 150 is fabricated in accordance with conventional processing techniques through the doping of n-type active areas 84, 85 prior to metalization of the junction contact using the silicidation processes as described herein. As such, prior to such metalization, the device structure 150 includes p-well 60 having field oxide regions 62 deposited thereon in accordance with conventional techniques. Further, stacks 64 and 66, i.e., word lines, are also formed followed by ion implantation for doping of n-type doped active regions 84 and 85. The stack 64 may include, for example, a gate oxide region 67, a polysilicon region 68, a metal silicide region 70 (such as, for example, tungsten silicide or cobalt silicide formed in accordance with the present invention), and an oxide region 74 (such as TEOS). Likewise, stack 66 includes a gate oxide region 75, a polysilicon region 76, a metal silicide region 78, and an oxide region 80. Further, the stacks 64 and 66 include spacers 72 and spacers 82, respectively, at the side walls thereof. Further, a mask region 86, such as BPSG or resist, is utilized for forming contact hole 151.

Figure 4B:
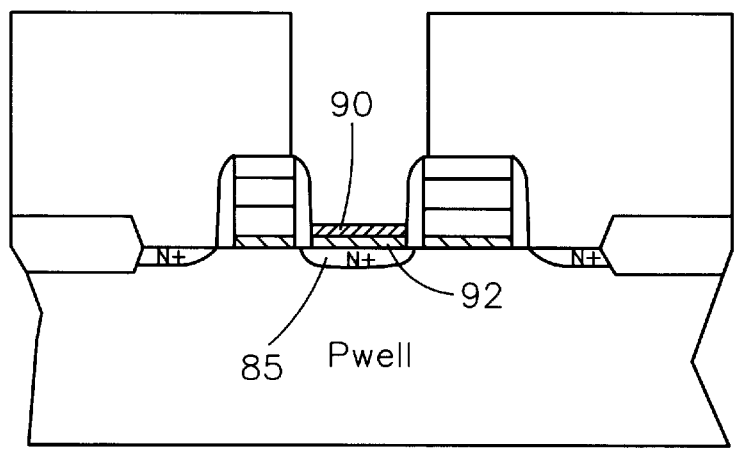
Figure 4C:
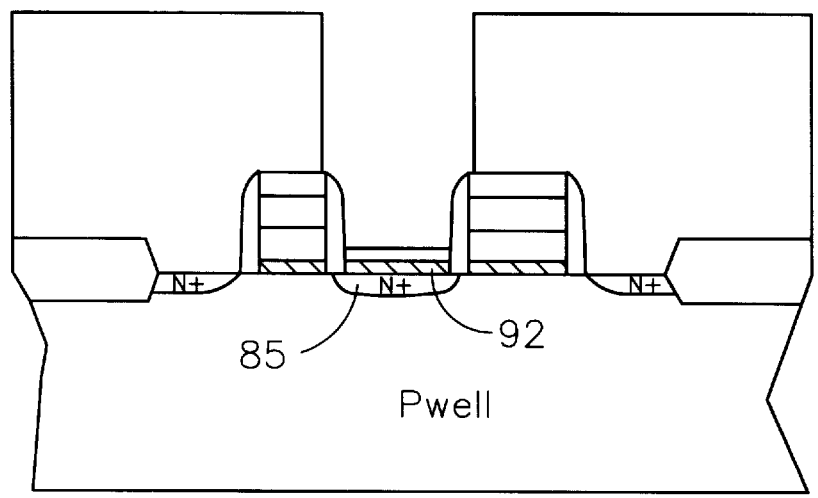
Figure 4D:
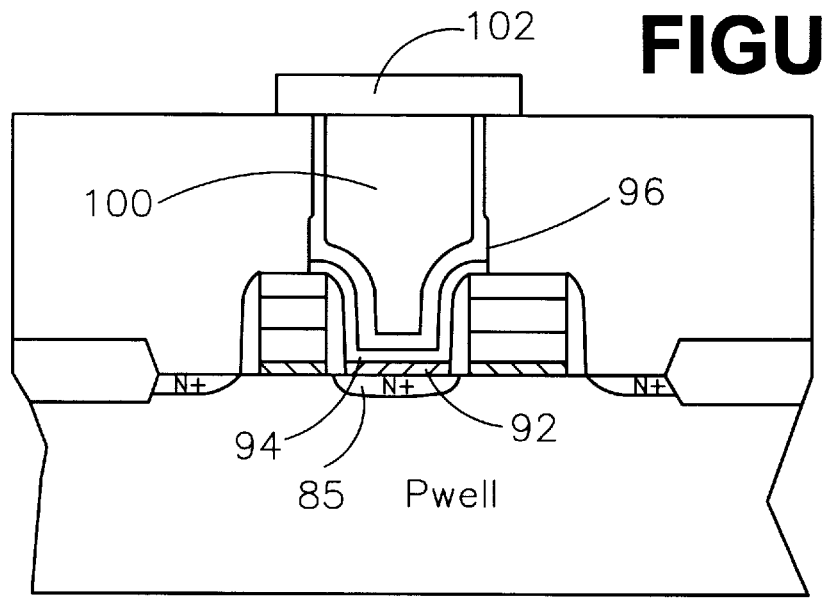

The n-type active region 85 is metalized or salicided in accordance with the present invention. As described with reference to FIGS. 1A–1C, nitridated cobalt layer 88 is formed in contact with the doped n-type active silicon region 85 and a thin titanium film cap 90 formed thereover. Thereafter, an anneal is performed to silicide the contact resulting in the cobalt silicide layer 92 and titanium film cap 90 as shown in FIG. 4B. After removal of the titanium film cap and any unreacted cobalt, the salicided contact as shown in FIG. 4C is completed. Various interconnect layers may then be formed thereon using conventional processes. For example, the resulting structure, as shown in FIG. 4D, may include the cobalt silicide region 92 over the active n-type region 85, other interconnect layers 94, 96, and 100 such as titanium nitride, tungsten or any other interconnect material typically deposited for interconnect functions. Thereafter, other metalization layers 102, such as aluminum or any other metal conventionally used may be deposited for connection to the bit line contact as is known to one skilled in the art.

Figure 5A:
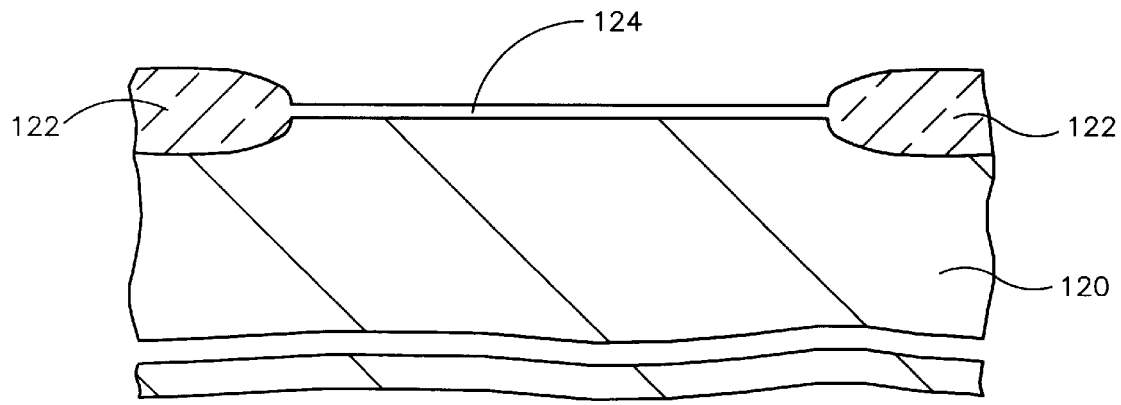
FIGS. 5A–5D are illustrative diagrams showing the formation of a polycide line in accordance with the present invention.

With reference to FIGS. 5A–5D, one process utilizing the present invention for forming a polycide line 132 (FIG. 5D) on the structure shown in FIG. 5A shall be described. FIG. 5A includes field oxide regions 122 formed on substrate 120 such as, for example, by conventional local oxidation of silicon (LOCOS) processing. Further, a gate insulating layer, i.e., a gate oxide 124, is formed on semiconductor substrate 120 in the active area formed by field oxide regions 122.

Figure 5B:
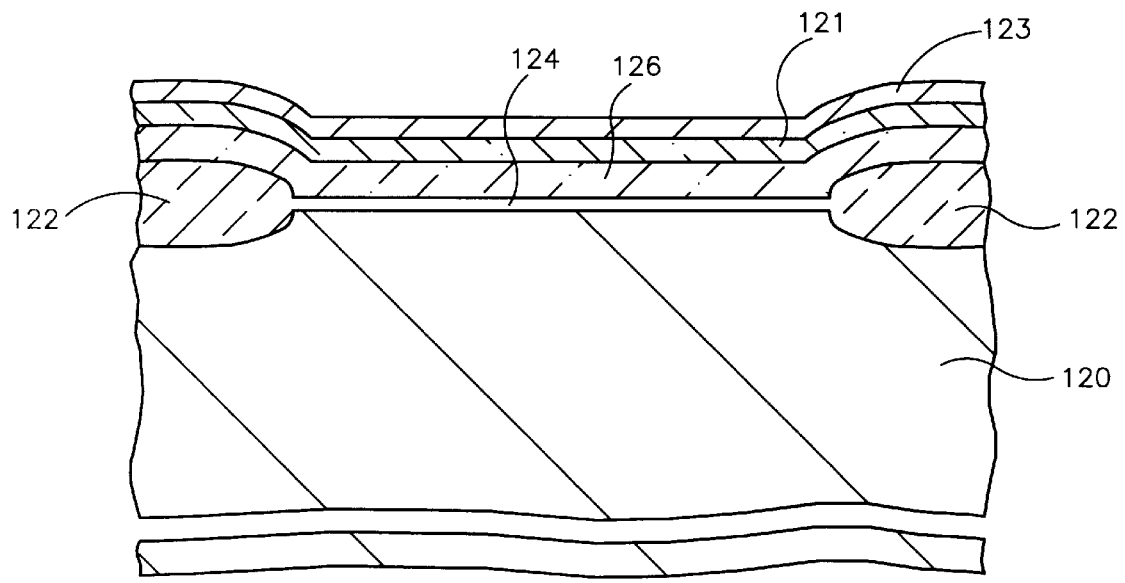

As shown in FIG. 5B, a layer of polysilicon 126 is formed over the field oxide regions 122 and gate oxide 124. The polysilicon layer 126 can be formed by any conventionally known method, such as by chemical vapor deposition or even by growth of polysilicon. For example, the polysilicon can be deposited using silicon hydrides or silanes such as dichlorosilane (DCS, $SiH_2Cl_2$), silane ($SiH_4$), disilane ($H_3SiSiH_3$), trichlorosilane (TCS, $SiHCl_3$), or any other silicon precursor known to one skilled in the art.

Figure 5C:
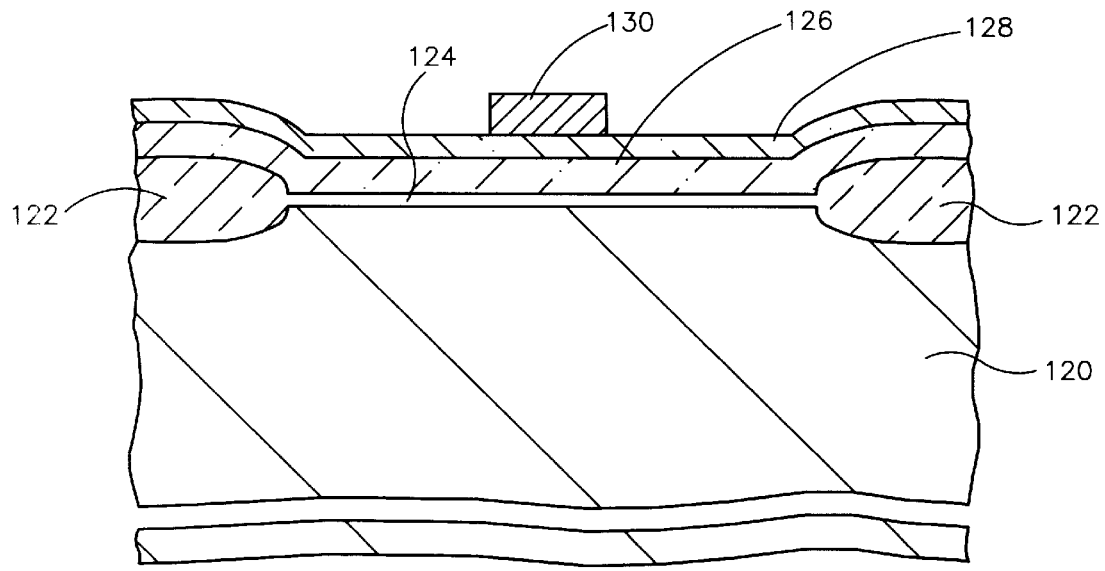
Figure 5D:
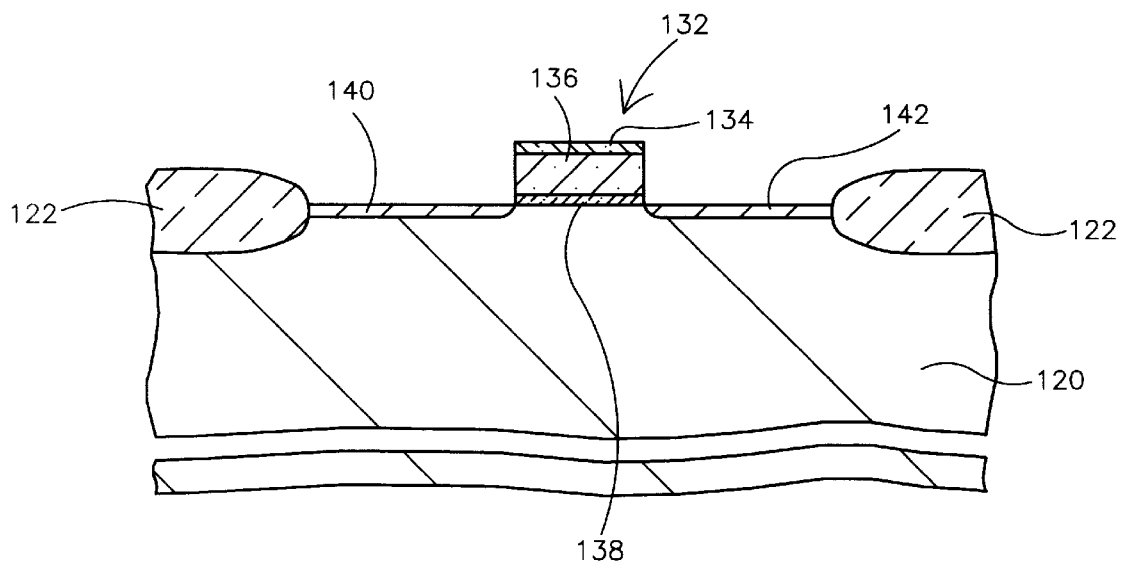

A layer of cobalt 121 is then formed on the polysilicon layer 126 in a manner as described previously with reference to FIGS. 1A–1C. Further as described previously, a titanium film cap 123 is formed over the cobalt layer 121. Upon the silicidation anneal, cobalt 121 reacts with the polysilicon layer 126 resulting in the cobalt silicide layer 128 formed over the polysilicon layer 126 (FIG. 5C). Thereafter, a resist 130 is utilized for patterning the polycide line 132. With the resist 130 removed, polycide line 132 is completed via wet and/or dry etching of portions of the polysilicon 126 and cobalt silicide 128 layers. The resulting polycide line, including polysilicon region 136 and cobalt silicide region 134, is shown in FIG. 5D. The formation of gate region 138 and doping of regions 140 and 142 may then be performed in accordance with conventional processing as well as other processes for completing the device desired.

The present invention has been described using cobalt as the silicidable metal. However, the processes described herein may also utilize nickel as the silicidable metal film with modifications as would be readily known or ascertained by one skilled in the art.

Although the invention has been described above with particular reference to various embodiments thereof, variations and modifications of the present invention can be made within a contemplated scope of the following claims.

What is claimed is:

1. A method for use in the fabrication of semiconductor devices, the method comprising the steps of:

forming a layer of nitridated cobalt on a surface of a substrate assembly, the substrate assembly including silicon;

forming a film cap including titanium over the layer of nitridated cobalt; and performing a thermal treatment to form cobalt silicide from the layer of cobalt and at least a portion of the silicon.

2. The method according to claim 1, wherein the formation of the film cap includes forming a thin cap of titanium or titanium nitride having a thickness less than about 15 nanometers.

3. The method according to claim 2, wherein the thickness of the film cap is in the range of about 3 nanometers to about 5 nanometers.

4. The method according to claim 1, wherein the surface of the substrate assembly includes silicon, wherein the layer of nitridated cobalt is formed on the surface including silicon, wherein the layer of nitridated cobalt is formed in an atmosphere including nitrogen, and further wherein the nitrogen incorporated into the layer of nitridated cobalt is of a percentage volume of about 10% or less.

5. The method according to claim 1, wherein the surface of the substrate assembly is a titanium surface of a titanium film formed over a region comprising silicon, the layer of nitridated cobalt being formed over the titanium film, and further where in the performance of the thermal treatment includes performing a titanium film and layer of nitridated cobalt reversal and silicidation process to form cobalt silicide from the layer of nitridated cobalt and at least a portion of the silicon of the region.

6. The method according to claim 5, wherein the reversal and silicidation step includes performing an anneal to form at least a titanium silicide region from the titanium film and at least a portion of the silicon of the region comprising silicon, and thereafter, performing an additional anneal to form cobalt silicide from the layer of cobalt and at least a portion of titanium silicide region and the silicon of the region comprising silicon.

7. The method according to claim 5, wherein the titanium film is formed in an atmosphere including at least one of nitrogen and oxygen.

8. The method according to claim 7, wherein the atmosphere includes less than about 3% by volume of nitrogen.

9. The method according to claim 8, wherein the atmosphere includes nitrogen in the range of about 0.01% to about 1% by volume.

10. The method according to claim 7, wherein the atmosphere includes less than about 10% by volume of oxygen.

11. The method according to claim 10, wherein the atmosphere includes oxygen in the range of about 0.01% to about 1% by volume.

12. A method for use in the fabrication of semiconductor devices, the method comprising the steps of:

forming a layer of nitridated cobalt on a surface of a silicon region;

forming a film cap including titanium over the layer of nitridated cobalt; and performing a thermal treatment to form cobalt silicide from the layer of nitridated cobalt and at least a portion of the silicon region.

13. The method according to claim 12, wherein the formation of the film cap includes forming a thin film cap of titanium or titanium nitride having a thickness less than about 15 nanometers.

14. The method according to claim 13, wherein the thickness of the thin titanium cap is in the range of about 3 nanometers to about 5 nanometers.

15. The method according to claim 12, wherein the layer of nitridated cobalt is formed in an atmosphere including nitrogen, and further wherein nitrogen incorporated in the layer of nitridated cobalt is of a percentage volume of about 10% or less.

16. The method according to claim 12, wherein the thermal treatment is performed at a temperature less than 900° C. to form the cobalt silicide from the layer of nitridated cobalt and at least a portion of the silicon region.

17. A method for use in forming an interconnect in the fabrication of semiconductor devices, the method comprising the steps of:

providing a silicon contact area;

forming a layer of nitridated cobalt on the silicon contact area;

forming a film cap including titanium over the layer of nitridated cobalt; and performing a thermal treatment to form cobalt silicide from the layer of nitridated cobalt and at least a portion of the silicon contact area.

18. The method according to claim 17, wherein the silicon contact area is a shallow junction contact area and further wherein the formation of the film cap includes forming a thin cap of titanium or titanium nitride having a thickness less than about 15 nanometers.

19. The method according to claim 17, wherein the layer of nitridated cobalt is formed in an atmosphere including nitrogen, and further wherein nitrogen incorporated in the layer of nitridated cobalt is of a percentage volume of about 10% or less.

20. A method for use in the fabrication of semiconductor devices, the method comprising the steps of:

providing a polysilicon layer on a surface;

forming a layer of nitridated cobalt on the polysilicon layer;

forming a film cap including titanium over the layer of nitridated cobalt;

performing a thermal treatment to form cobalt silicide from the layer of nitridated cobalt and at least a portion of the silicon region; and removing portions of the cobalt silicide and the polysilicon thereunder to form a polycide line.

21. The method according to claim 20, wherein the formation of the film cap includes forming a thin cap including titanium or titanium nitride having a thickness less than about 15 nanometers.

22. The method according to claim 20, wherein the layer of nitridated cobalt is formed in an atmosphere including nitrogen, and further wherein nitrogen incorporated in the layer of nitridated cobalt is of a percentage volume of about 10% or less.

23. The method according to claim 20, wherein the polycide line is one of a bit line, word line, and a local interconnect.

* * * * *

UNITED STATES PATENT AND TRADEMARK OFFICE
CERTIFICATE OF CORRECTION

PATENT NO.: 6,127,249
DATED: October 3, 2000
INVENTOR(S): Jeff Hu

It is certified that error appears in the above-identified patent and that said Letters Patent is hereby corrected as shown below:

On the title page:
      in T.J. Selinder et al. citation, please delete "Si9100)" and insert therefor --Si(100)--;

Page 2, in Q. F. Wang et al. citation, please delete "new" and insert therefor --New--;

Column 14, line 47, please insert --5% to-- before "about 10%" and delete "or less";

Column 15, lines 31-32, please insert --5% to-- before "about 10%" and delete "or less";

Column 16, lines 14-15, please insert --5% to-- before "about 10%" and delete "or less"; and Column 16, lines 36-37, please insert --5% to-- before "about 10%" and delete "or less".

Signed and Sealed this

Eighth Day of May, 2001

*Attest:*

NICHOLAS P. GODICI

*Attesting Officer*  *Acting Director of the United States Patent and Trademark Office*